United States Patent
Xia

(10) Patent No.: US 12,333,204 B1
(45) Date of Patent: Jun. 17, 2025

(54) BOX-TYPE SCREEN SPLITTER

(71) Applicant: Gongjun Xia, Anhui Province (CN)

(72) Inventor: Gongjun Xia, Anhui Province (CN)

(*) Notice: Subject to any disclaimer, the term of this patent is extended or adjusted under 35 U.S.C. 154(b) by 0 days.

(21) Appl. No.: 19/065,099

(22) Filed: Feb. 27, 2025

(30) Foreign Application Priority Data

Feb. 18, 2025 (CN) .......................... 202510181977.6

(51) Int. Cl.
G06F 3/14 (2006.01)
G06F 1/16 (2006.01)
H05K 5/02 (2006.01)

(52) U.S. Cl.
CPC ............ *G06F 3/1446* (2013.01); *G06F 1/166* (2013.01); *H05K 5/0204* (2013.01)

(58) Field of Classification Search
CPC .... G06F 1/1613; G06F 1/1615; G06F 1/1616; G06F 1/1618; H05K 5/0204
See application file for complete search history.

(56) References Cited

U.S. PATENT DOCUMENTS

| | | | | |
|---|---|---|---|---|
| 4,105,182 A * | 8/1978 | Jacobson | .............. | B42F 13/402 |
| | | | | 248/459 |
| 4,240,761 A * | 12/1980 | Jacobson | .............. | B42F 13/402 |
| | | | | 402/72 |
| 7,758,009 B1 * | 7/2010 | Chang | .................. | A47B 23/044 |
| | | | | 248/456 |
| D985,551 S * | 5/2023 | Chen | ........................... | D14/315 |
| 2003/0160138 A1 * | 8/2003 | Rawlings | ............... | F16M 13/00 |
| | | | | 248/917 |
| 2011/0180682 A1 * | 7/2011 | Tarnutzer | ............ | A47B 23/043 |
| | | | | 248/447 |
| 2011/0299231 A1 * | 12/2011 | Gaddis, II | .............. | H05K 5/023 |
| | | | | 361/679.01 |
| 2012/0113572 A1 * | 5/2012 | Gaddis, II | ............. | G06F 1/1628 |
| | | | | 361/679.01 |
| 2012/0153116 A1 * | 6/2012 | Harrison | ............... | G06F 1/1626 |
| | | | | 206/320 |
| 2013/0334376 A1 * | 12/2013 | Moscovitch | ........... | F16M 11/00 |
| | | | | 248/125.1 |
| 2015/0085433 A1 * | 3/2015 | Kim | ...................... | G06F 1/1643 |
| | | | | 361/679.01 |
| 2015/0374118 A1 * | 12/2015 | van Hooft | ............. | F16B 11/006 |
| | | | | 248/451 |
| 2018/0210515 A1 * | 7/2018 | Lyles | ..................... | G06F 1/1656 |
| 2018/0234127 A1 * | 8/2018 | Lambert | ................ | A45C 11/00 |
| 2020/0208773 A1 * | 7/2020 | Lin | ...................... | H04B 1/3888 |
| 2021/0286408 A1 * | 9/2021 | Chueh | .................. | H05K 5/0226 |

(Continued)

*Primary Examiner* — Sepehr Azari

(57) ABSTRACT

The invention relates to a box-type screen splitter, including a storage box and a screen, wherein the storage box includes a box body, an upper cover and a bottom cover, the box body, the upper cover and the bottom cover define a receiving cavity, and the length, width and height of the screen are less than the length, width and height of the receiving cavity, respectively; the upper cover includes a first cover rotatably provided at the upper left of the box body and a second cover rotatably provided at the upper right of the box body; a first connecting portion is provided on an upper surface of the first cover. By implementing the above technical solution, the following technical effects are achieved: The screen splitter is flexible in use angle, and after being folded, has a small size, is moved easily and is stable during storage, use and movement.

8 Claims, 4 Drawing Sheets

(56) References Cited

U.S. PATENT DOCUMENTS

| | | | |
|---|---|---|---|
| 2022/0308628 A1* | 9/2022 | Jin ........................ | G06F 1/1686 |
| 2023/0020938 A1* | 1/2023 | Liu ...................... | F16M 11/041 |
| 2023/0034502 A1* | 2/2023 | Lin ...................... | A47B 23/044 |
| 2023/0333597 A1* | 10/2023 | Bustamante .......... | G06F 1/1647 |
| 2024/0397640 A1* | 11/2024 | Hyun ................... | H05K 5/0226 |
| 2025/0071917 A1* | 2/2025 | Choi .................... | H05K 5/0226 |

\* cited by examiner

BOX-TYPE SCREEN SPLITTER

CROSS-REFERENCE TO RELATED APPLICATIONS

The application claims priority of Chinese patent application CN202510181977.6, filed on Feb. 18, 2025, which is incorporated herein by reference in its entireties.

BACKGROUND OF THE INVENTION

1. Technical Field

The present invention relates to the technical field of box-type screen splitters and, in particular, to a box-type screen splitter.

2. Description of Related Art

At present, large screen splitters are not flexible enough in use angle when used, and it is inconvenient to move the large screen splitters, causing unstable structure and high damage risk. Small screen splitters have unsatisfactory use experience due to the small screen area.

BRIEF SUMMARY OF THE INVENTION

The present invention provides a box-type screen splitter and solves the problems of the existing mode.

To achieve the above objective, the present invention provides the following technical solution: A box-type screen splitter, including a storage box 1 and a screen 2, wherein the storage box 1 includes a box body 11, an upper cover 12 and a bottom cover 13, the box body 11, the upper cover 12 and the bottom cover 13 define a receiving cavity, and the length, width and height of the screen 2 are less than the length, width and height of the receiving cavity, respectively; the upper cover 12 includes a first cover 121 rotatably provided at the upper left of the box body 11 and a second cover 122 rotatably provided at the upper right of the box body 11, a first connecting portion 1211 is provided on an upper surface of the first cover 121, a handle 1212 is provided on a left side of the first cover 121, the bottom cover 13 is provided under the box body 11, and a left side of the bottom cover 13 is provided with a first hole 131 corresponding to the handle 1212; the screen 2 includes a first display screen 21, a second display screen 22 and a third display screen 23, the first display screen 21 is rotatably connected to one side of the second display screen 22, the other side of the second display screen 22 is rotatably connected to the third display screen 23, a second connecting portion 221 is provided on the back of the second display screen 22, and the first connecting portion 1211 is movably connected to the second connecting portion 221.

Preferably, the box-type screen splitter comprises a first bracket 123, wherein one end of the first bracket 123 is rotatably provided under the second cover 122, and the other end of the first bracket 123 is provided with a first snap-fit portion 1231; a plurality of second holes 1221 are formed in an array in the bottom cover 13, and the first snap-fit portion 1231 is capable of being caught in the second holes 1221.

Preferably, a second snap-fit portion 1232 is provided at a lower surface of the first bracket 123, and the second cover 122 is provided with a third hole 1222 corresponding to the second snap-fit portion 1232.

Preferably, a first extension portion 1213 is provided rightward at the lower right of the first cover 121, a second extension portion 1223 is provided leftward at the upper left of the second cover 122 to mate the first extension portion 1213, and the box body 11 is provided with first grooves 111 corresponding to the first extension portion 1213 and the second extension portion 1223.

Preferably, the first connecting portion 1211 and the second connecting portion 221 are magnetic devices with opposite magnetism.

Preferably, anti-slid strips 1224 are provided on the upper surface of the second cover 122.

Preferably, buffer pads are provided on an upper surface of the first cover 121, a lower surface of the bottom cover 13, and the back of the screen 2.

Preferably, a 75 mm mounting hole is provided on the back of the screen 2, and a TYPE-C interface and a MINI HDMI interface are provided on the screen 2.

By implementing the above technical solutions, the following technical effects are achieved: The box-type screen splitter is flexible in use angle and has a large usable screen. After being folded, the box-type screen splitter has a small size, can be moved easily and is stable during storage, use and movement.

DETAILED DESCRIPTION OF THE INVENTION

In order to better understand the technical solution of the invention, the embodiments of the invention are described in detail below with reference to the accompanying drawings.

Figure 1:
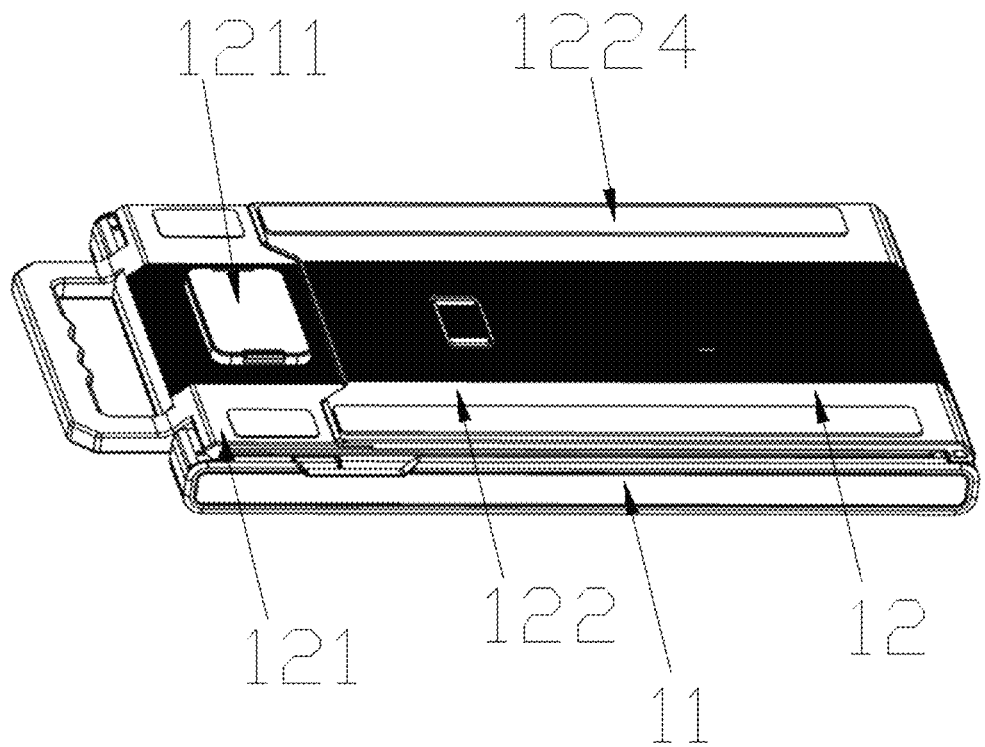
FIG. 1 is an overall schematic structural diagram (stereoscopic diagram) of the box-type screen splitter according to the present invention in the folded state.
Figure 2:
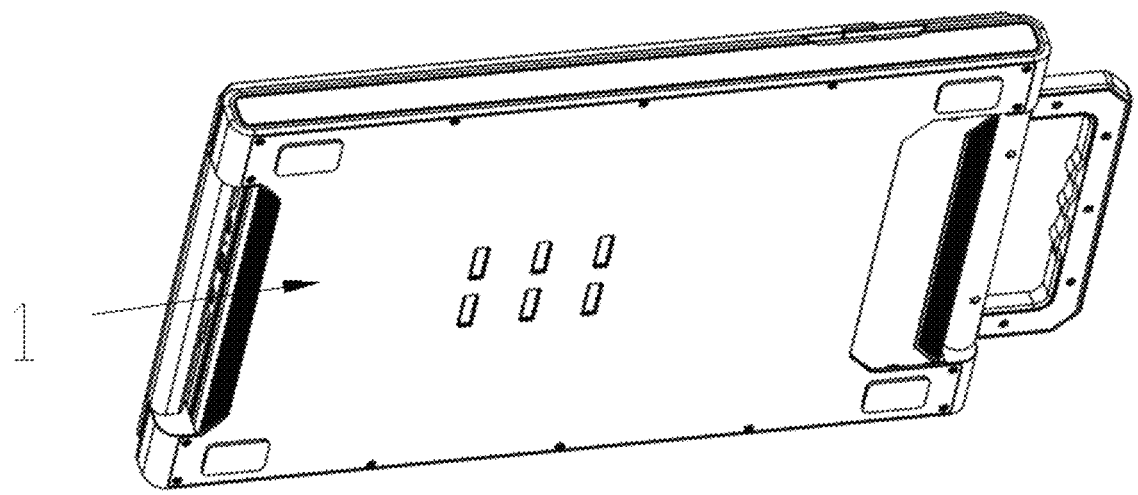
FIG. 2 is an overall schematic structural diagram (stereoscopic diagram) of the box-type screen splitter according to the present invention in the folded state.
Figure 3:
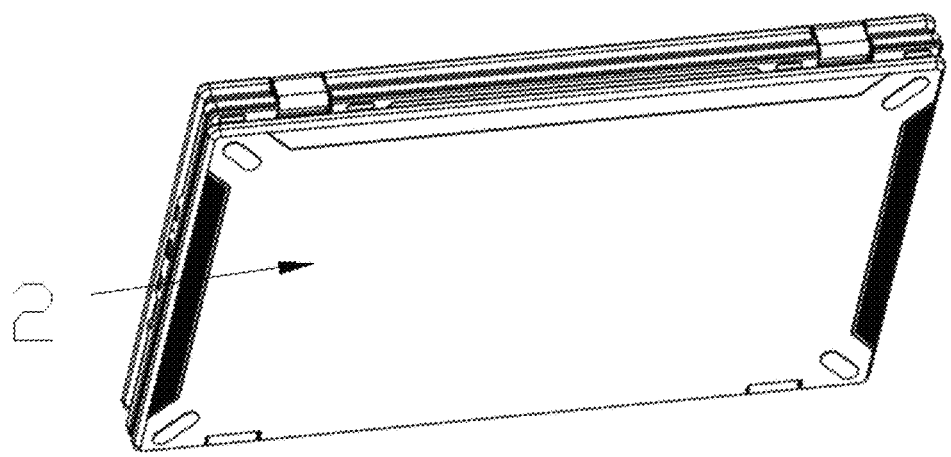
FIG. 3 is a partial schematic structural diagram (stereoscopic diagram) of the box-type screen splitter according to the present invention in FIG. 2.
Figure 4:
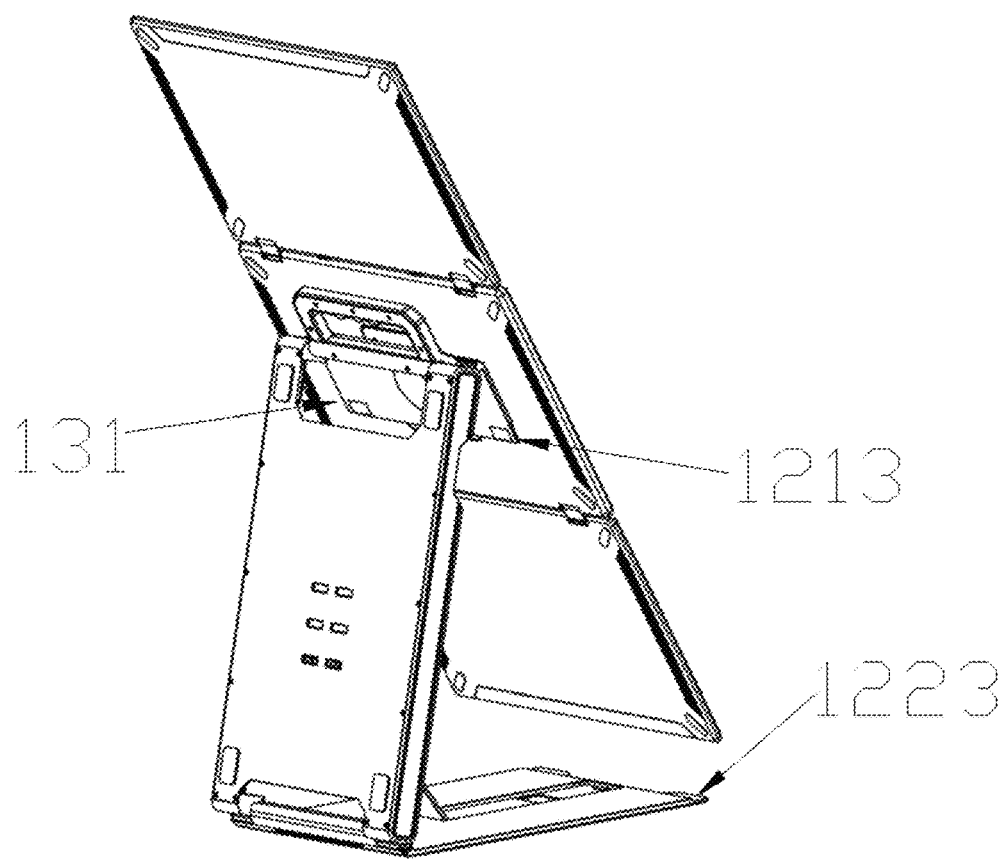
FIG. 4 is an overall schematic structural diagram (stereoscopic diagram) of the box-type screen splitter according to the present invention in the use state.
Figure 5:
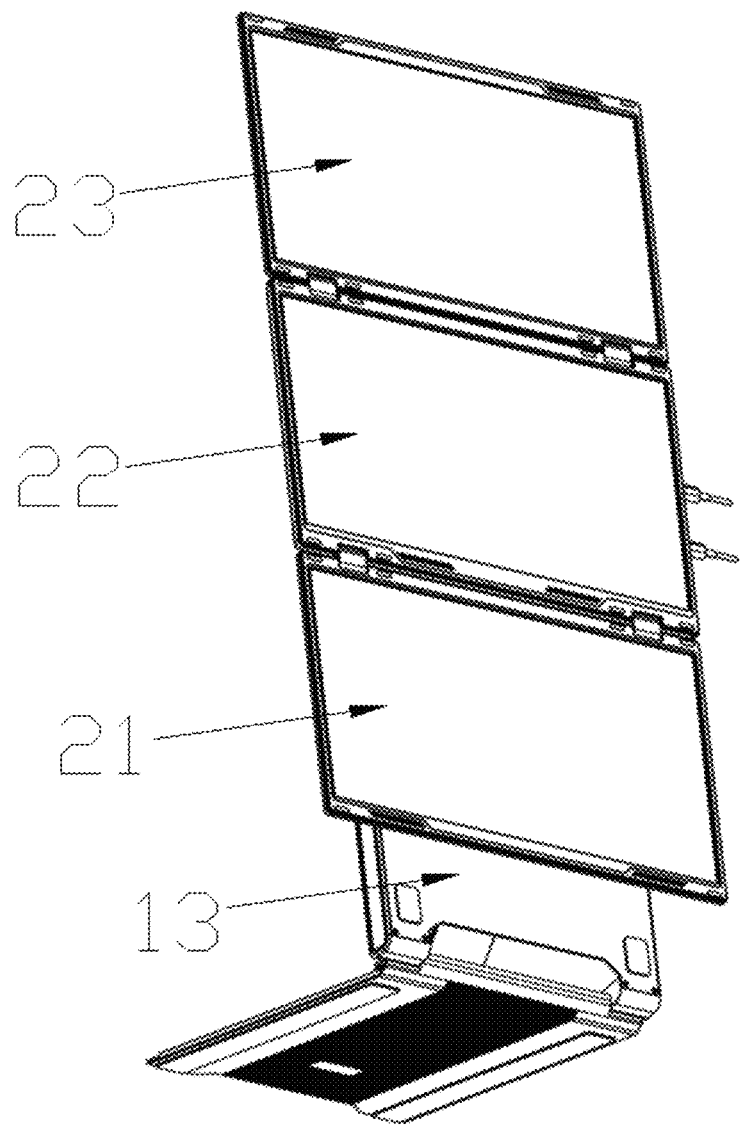
FIG. 5 is an overall schematic structural diagram (stereoscopic diagram) of the box-type screen splitter according to the present invention in the use state.
Figure 6:
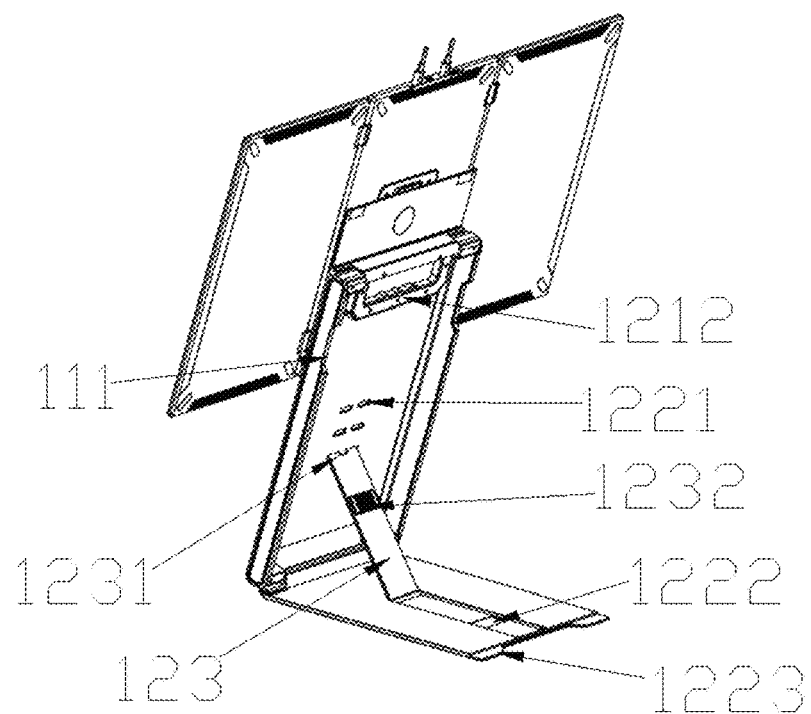
FIG. 6 is an overall schematic structural diagram (stereoscopic diagram) of the box-type screen splitter according to the present invention in the use state.
Figure 7:
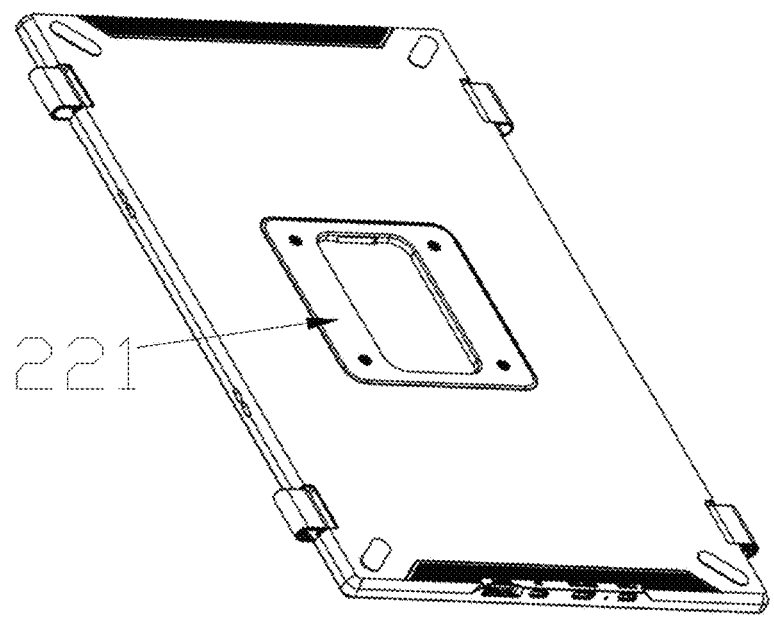
FIG. 7 is a partial schematic structural diagram (stereoscopic diagram) of the box-type screen splitter according to the present invention.

As shown in FIGS. 1-7, it should be appreciated that this embodiment provides a box-type screen splitter, including a storage box 1 and a screen 2, wherein the storage box 1 includes a box body 11, an upper cover 12 and a bottom cover 13, the box body 11, the upper cover 12 and the bottom cover 13 define a receiving cavity, and the length, width and height of the screen 2 are less than the length, width and height of the receiving cavity, respectively; the upper cover 12 includes a first cover 121 rotatably provided at the upper left of the box body 11 and a second cover 122 rotatably provided at the upper right of the box body 11, a first connecting portion 1211 is provided on an upper surface of the first cover 121, a handle 1212 is provided on a left side of the first cover 121, the bottom cover 13 is provided under the box body 11, and a left side of the bottom cover 13 is provided with a first hole 131 corresponding to the handle 1212; the screen 2 includes a first display screen 21, a second display screen 22 and a third display screen 23, the first display screen 21 is rotatably connected to one side of the second display screen 22, the other side of the second display screen 22 is rotatably connected to the third display screen 23, a second connecting portion 221 is provided on the back of the second display screen 22, and the first connecting portion 1211 is movably connected to the second connecting portion 221.

To use the screen splitter, the first cover 121 and the second cover 122 are opened and the screen 2 is taken from the receiving cavity and unfolded. Preferably, the second cover 122 is opened to an angle of about 60 degrees from the box body 11, the first cover 121 is opened to a position parallel to the bottom cover 13, the second cover 122 is placed on a horizontal table top to form a support portion composed of the second cover 122, the box body 11 and the bottom cover 13. Then, the first connecting portion 1211 is movably connected to the second connecting portion 221. In use, the elevation angle of the screen can be changed by rotating the first cover 121, and the screen 2 can be used as a horizontal screen or a vertical screen by rotating the screen 2 relative to the first connecting portion 1211. By rotating and changing the relative positions of the first display screen 21, the second display screen 22 and the third display screen 23, three screens can be used facing one side or with one screen facing one side and the remaining two screens facing the other side for use by multiple users. When the screen splitter is used for multiple users, the screen is rotated to the side where the bottom cover 13 is located and during this process, the handle 1212 rotates together with the first cover 121 and passes through the first hole 131, so that the screen splitter has more use angles. Moreover, at such an angle, the center of gravity of the screen is closer to the center of gravity of the second cover 122, so the screen splitter is more stable when used. Finally, the screen splitter has the function of flexible use angles, stable center of gravity, and allowing multiple screens to be used simultaneously.

When the screen splitter is not in use, the screen 2 is placed into the storage box 1, and the first cover 121 and the second cover 122 are closed to fix the position of the screen 2. In this case, the handle 1212 rotates together with the first cover 121 to the other side and is parallel to the bottom cover 13. In this way, it is convenient to move; moreover, the first cover 121 connected to the handle 1212 naturally presses the position of the screen 2, thereby improving the stability of the product in a folded state when the product is moved and improving user experience. When the screen splitter is in storage, the screen 2 is placed in the storage box 1, the storage size of the screen splitter is minimized, and the screen is protected from dust pollution, and the risk of screen damage is reduced.

In this embodiment, the movable connection between the first connecting portion 1211 and the second connecting portion (221) may be snap connection, magnetic connection, a combination of snap connection and magnetic connection, or any other connection method or combination that can achieve the movable connection. The screen may also include a fourth screen or more screens.

In Embodiment 2, the box-type screen splitter comprises a first bracket 123, wherein one end of the first bracket 123 is rotatably provided under the second cover 122, and the other end of the first bracket 123 is provided with a first snap-fit portion 1231; a plurality of second holes 1221 are formed in an array in the bottom cover 13, and the first snap-fit portion 1231 is capable of being caught in the second holes 1221. According to different use height requirements, the first bracket 123 is caught into different holes of the second holes 1221 in an array, so that the first bracket 123, the second cover 122 and the bottom cover 13 form a stable and height-adjustable triangular bracket. In this way, product stability is improved and different use height requirements of users in different scenarios are met, thereby improving user experience.

Based on the embodiments described above, further, a second snap-fit portion 1232 is provided at a lower surface of the first bracket 123, and the second cover 122 is provided with a third hole 1222 corresponding to the second snap-fit portion 1232. When the screen splitter is not in use, the second snap-fit portion 1232 is caught in the third hole 1222, so that the screen splitter has the smallest overall size and keeps stable when the first bracket 123 is in a folded state, thereby improving user experience.

Based on the embodiments described above, further, a first extension portion 1213 is provided rightward at the lower right of the first cover 121, a second extension portion 1223 is provided leftward at the upper left of the second cover 122 to mate the first extension portion 1213, and the box body 11 is provided with first grooves 111 corresponding to the first extension portion 1213 and the second extension portion 1223. When the screen splitter is not in use, after the screen is placed into the storage box, the first extension portion 1213 is retracted and presses the screen, and then the second extension portion 1223 is retracted and presses the first extension portion 1213, so that the screen splitter in the folded state has the smallest overall size and keeps stable, thereby improving user experience.

Based on the embodiments described above, further, the first connecting portion 1211 and the second connecting portion 221 are magnetic devices with opposite magnetism. This is an implementation method for movably connecting the first connecting portion 1211 and the second connecting portion 221. In this way, it is more convenient for the movable connection and separation of the screen 2 and the storage box 1.

Based on the embodiments described above, further, anti-slid strips 1224 are provided on the upper surface of the second cover 122. When the screen splitter is in use, the second cover 122 is used as a support, and the upper surface of the second cover 122 is close to a desktop, and the anti-slid strips 1224 can improve product stability.

Based on the embodiments described above, further, buffer pads are provided on an upper surface of the first cover 121, a lower surface of the bottom cover 13, and the back of the screen 2. When the first connecting portion 1211 is connected to the second connecting portion 221, the back of the second display screen 22 presses against the buffer pads on the upper surface of the first cover 121 and the lower surface of the bottom cover 13, thereby fixing the position of the screen and improving the user experience. The buffer pads on the back of the screen 2 are used to fix the relative positions of the first display screen 21, the second display screen 22 and the third display screen 23 when the screen is stored. In this way, the screen is prevented from being crushed, thereby increasing the service life.

Based on the embodiments described above, further, a 75 mm mounting hole is provided at the back of the screen 2. The model of the mounting hole is the one with a high probability of use. This arrangement brings convenience for adapting to brackets and for use in different scenarios. A TYPE-C interface and a MINI HDMI interface are provided on the screen 2, thereby meeting different connection requirements and improving the user experience.

The above is a detailed description of the box-type screen splitter in the embodiments of the present invention. For those skilled in the art, according to the idea of the embodiments of the invention, there will be changes in the specific implementation method and application scope. In summary, the content of this specification should not be understood as a limitation on the invention.

What is claimed is:

1. A box-type screen splitter, characterized by, comprising a storage box (1) and a screen (2), wherein the storage box (1) comprises a box body (11), an upper cover (12) and a bottom cover (13), the box body (11), the upper cover (12) and the bottom cover (13) define a receiving cavity, and the length, width and height of the screen (2) are less than the length, width and height of the receiving cavity, respectively;

the upper cover (12) comprises a first cover (121) rotatably provided at the upper left of the box body (11) and a second cover (122) rotatably provided at the upper right of the box body (11), a first connecting portion (1211) is provided on an upper surface of the first cover (121), a handle (1212) is provided on a left side of the first cover (121), the bottom cover (13) is provided under the box body (11), and a left side of the bottom cover (13) is provided with a first hole (131) corresponding to the handle (1212);

the screen (2) comprises a first display screen (21), a second display screen (22) and a third display screen (23), the first display screen (21) is rotatably connected to one side of the second display screen (22), the other side of the second display screen (22) is rotatably connected to the third display screen (23), a second connecting portion (221) is provided on the back of the second display screen (22), and the first connecting portion (1211) is movably connected to the second connecting portion (221).

2. The box-type screen splitter according to claim 1, characterized by, comprising a first bracket (123), wherein one end of the first bracket (123) is rotatably provided under the second cover (122), and the other end of the first bracket (123) is provided with a first snap-fit portion (1231);

a plurality of second holes (1221) are formed in an array in the bottom cover (13), and the first snap-fit portion (1231) is capable of being caught in the second holes (1221).

3. The box-type screen splitter according to claim 2, characterized in that, a second snap-fit portion (1232) is provided at a lower surface of the first bracket (123), and the second cover (122) is provided with a third hole (1222) corresponding to the second snap-fit portion (1232).

4. The box-type screen splitter according to claim 1, characterized in that, a first extension portion (1213) is provided rightward at the lower right of the first cover (121), a second extension portion (1223) is provided leftward at the upper left of the second cover (122) to mate the first extension portion (1213), and the box body (11) is provided with first grooves (111) corresponding to the first extension portion (1213) and the second extension portion (1223).

5. The box-type screen splitter according to claim 1, characterized in that, the first connecting portion (1211) and the second connecting portion (221) are magnetic devices with opposite magnetism.

6. The box-type screen splitter according to claim 1, characterized in that, anti-slid strips (1224) are provided on an upper surface of the second cover (122).

7. The box-type screen splitter according to claim 1, characterized in that, buffer pads are provided on the upper surface of the first cover (121), a lower surface of the bottom cover (13), and the back of the screen (2).

8. The box-type screen splitter according to claim 1, characterized in that, a 75 mm mounting hole is provided on the back of the screen (2), and a TYPE-C interface and a MINI HDMI interface are provided on the screen (2).

* * * * *